(12) United States Patent
Gilsdorf

(10) Patent No.: US 7,239,651 B2
(45) Date of Patent: Jul. 3, 2007

(54) DESYNCHRONIZER HAVING RAM BASED SHARED DIGITAL PHASE LOCKED LOOPS AND SONET HIGH DENSITY DEMAPPER INCORPORATING SAME

(75) Inventor: John F. Gilsdorf, Derby, CT (US)

(73) Assignee: Transwitch Corporation, Shelton, CT (US)

( * ) Notice: Subject to any disclaimer, the term of this patent is extended or adjusted under 35 U.S.C. 154(b) by 970 days.

(21) Appl. No.: 10/094,768

(22) Filed: Mar. 11, 2002

(65) Prior Publication Data

US 2003/0169773 A1 Sep. 11, 2003

(51) Int. Cl.
*H04L 7/00* (2006.01)
*H04J 3/06* (2006.01)
*H04L 25/00* (2006.01)

(52) U.S. Cl. .............. 370/503; 370/516; 375/371; 375/373

(58) Field of Classification Search ............ 370/518, 370/503, 516, 517, 470, 203
See application file for complete search history.

(56) References Cited

U.S. PATENT DOCUMENTS

| | | | |
|---|---|---|---|
| 3,982,077 A | 9/1976 | Clark et al. ............ 179/15 BV |
| 4,375,681 A | 3/1983 | Abbott et al. ............ 370/16 |
| 4,460,993 A | 7/1984 | Hampton et al. ............ 370/84 |
| 4,488,293 A | 12/1984 | Haussmann et al. ......... 370/84 |
| 4,660,169 A | 4/1987 | Norgren et al. ............ 364/900 |
| 4,685,101 A | 8/1987 | Segal et al. ............ 370/84 |
| 4,727,536 A | 2/1988 | Reeves et al. ............ 370/84 |
| 4,750,168 A | 6/1988 | Trevitt ............ 370/85 |
| 4,815,074 A | 3/1989 | Jacobsen ............ 370/112 |
| 5,048,012 A | 9/1991 | Gulick et al. ............ 370/77 |
| 5,276,678 A | 1/1994 | Hendrickson et al. ....... 370/62 |
| 5,835,543 A | 11/1998 | Mazzurco et al. ......... 375/372 |
| 5,893,162 A | 4/1999 | Lau et al. ............ 711/153 |
| 6,876,652 B1 * | 4/2005 | Bell et al. ............ 370/386 |
| 6,982,995 B2 * | 1/2006 | Acimovic ............ 370/518 |
| 2002/0093971 A1 * | 7/2002 | Yasuo et al. ............ 370/403 |
| 2002/0125961 A1 * | 9/2002 | Jones et al. ............ 331/27 |

* cited by examiner

*Primary Examiner*—Seema S. Rao
*Assistant Examiner*—Robert C. Scheibel, Jr.
(74) *Attorney, Agent, or Firm*—Gordon & Jacobson, P.C.

(57) ABSTRACT

A SONET demapper includes three desynchronizers, each of which includes a RAM-based, shared digital phase locked loop, shared elastic storage, and twenty-eight divide-by 33/34/44/45 counters. Unlike a conventional desynchronizer which uses separate FIFOs for each of the twenty-eight T1/E1 channels, the elastic storage for each channel is an addressed portion of a shared block of RAM. Each desynchronizer generates a clock for each of the twenty-eight T1/E1 channels based on a FIFO depth count for each channel which is derived from a read pointer, an "effective write pointer", and the divide-by clock for the channel. Each desynchronizer can desynchronize both T1/E1 signals as well as a combination of these signals. In addition, the invention combines the leak FIFO and desynchronizer FIFO into a single FIFO with an effective write pointer. This eliminates the need to maintain separate counters and pointers for separate FIFOs.

13 Claims, 3 Drawing Sheets

DESYNCHRONIZER HAVING RAM BASED SHARED DIGITAL PHASE LOCKED LOOPS AND SONET HIGH DENSITY DEMAPPER INCORPORATING SAME

BACKGROUND OF THE INVENTION

1. Field of the Invention

The invention relates to telecommunications. More particularly, the invention relates to desynchronizers utilized in a high density demapper for a SONET network component.

2. State of the Art

The Synchronous Optical Network (SONET) or the Synchronous Digital Hierarchy (SDH), as it is known in Europe, is a common transport scheme which is designed to accommodate both DS-1 (T1) and E1 traffic as well as multiples (DS-3 and E-3) thereof. A DS-1 signal consists of up to twenty-four time division multiplexed DS-0 signals plus an overhead bit. Each DS-0 signal is a 64 kb/s signal and is the smallest allocation of bandwidth in the digital network, i.e. sufficient for a single telephone connection. An E1 signal consists of up to thirty-two time division multiplexed DS-0 signals with at least one of the DS-0s carrying overhead information. Developed in the early 1980s, SONET has a base (STS-1) rate of 51.84 Mbit/sec in North America. The STS-1 signal can accommodate 28 DS-1 signals or 21 E1 signals or a combination of both. In Europe, the base (STM-1) rate is 155.520 Mbit/sec, equivalent to the North American STS-3 rate (3*51.84=155.520). The STS-3 (STM-1) signals can accommodate 63 E1 signals or 84 DS-1 signals, or a combination of both. When combined in an STS-3 (STM-1) signal, the individual E1 and/or T1 signals are referred to as tributary units (TUs) or channels. The abbreviation STS stands for Synchronous Transport Signal and the abbreviation STM stands for Synchronous Transport Module. STS-n signals are also referred to as Optical Carrier (OC-n) signals when transported optically rather than electrically.

Within the synchronous optical network structure, traffic consisting of continuous signals (e.g. T1 and E1 signals) are transported between network elements by "mapping" the signals into "containers" or "tributaries" of different sizes. Payload mapping in SONET or SDH is not uniform, resulting in payload bits being assigned to complete bytes. Some of these bytes contain overhead information or reserved bits. This generates "mapping jitter". As the payloads of the containers are passed from the originating point through network elements to the terminating point, they are remapped into other containers that may be timed by different clocks. Clock differences are compensated by the use of pointers that identify the start of the virtual container carrying a T1 or E1 signal. Periodic pointer increments and decrements indicate payload movement and result in "pointer jitter". When the signals are eventually restored from the last container, by "demapping", there are instantaneous periods where the restored data may burst or carry no information. This irregularity in signals is referred to generally as "jitter". When the signal is returned to its original form, i.e. a plurality of T1/E1 signals, desynchronizers are used to create a continuous stream of bits at the average originating clock rate with little or no jitter and with no loss of data. Current desynchronizers remove mapping and pointer jitter by the use of elastic storage of information where the storage level of the elastic store device defines the output of a phase locked loop used to regenerate the average originating clock.

In a conventional demapper/desynchronizer, a separate phase locked loop and elastic storage (FIFO) is provided for each T1/E1 signal. Each phase locked loop includes circuitry for desynchronizing a T1 signal or an E1 signal, but not both. Consequently, in order to provide sufficient desynchronizers for a completely de-mapped STS-3 signal, conventional equipment provides 63 E1 desynchronizers or 84 T1 desynchronizers or a combination of both. In order to be assured of the capability of desynchronizing any combination of T1 and E1 signals, the equipment must include 63 E1 desynchronizers and 84 T1 desynchronizers. This results in a relatively large number of unused desynchronizers at any given time.

The modern practice in SONET technology is to provide switch components on chips which, when linked together, form "path", "section", and "line" terminating equipment. Signals are treated differently at path, section, and line terminating equipment. At line and section terminating equipment, some or all signals may be remapped without demapping or desynchronizing. At path terminating equipment all signals are demapped and desynchronized. Thus, it is desirable to provide a demapper/desynchronizer on a separate chip or set of chips because some terminating equipment will not need any demapper/desynchronizer. However, it is not practical to provide 63+84 desynchronizers on a single chip.

SUMMARY OF THE INVENTION

It is therefore an object of the invention to provide a desynchronizer for a SONET signal demapper.

It is also an object of the invention to provide a SONET signal demapper which has desynchronizers for both T1 and E1 signals.

It is another object of the invention to provide a SONET signal demapper which does not have a large number of unused desynchronizers.

It is still another object of the invention to provide a SONET signal demapper which can handle all of the tributaries in an STS-3 multiplexed signal.

It is yet another object of the invention to provide a SONET signal demapper which makes efficient use of chip space.

In accord with these objects which will be discussed in detail below, a demapper according to the present invention includes three desynchronizers, each of which includes elastic storage and a plurality of digital phase locked loops. The phase locked loops are implemented with shared circuitry for generating read addresses for the elastic storage and a plurality, e.g. twenty-eight, divide-by 33/34/44/45 counters. Unlike a conventional desynchronizer which uses separate FIFOs for each of the twenty-eight T1/E1 channels, the elastic storage for each channel is an addressed portion of a shared block of RAM. Each desynchronizer is driven by a 68.68 MHz clock which runs a time wheel counter. The time wheel counter multiplexes among pointers to RAM and registers, and also selects the appropriate divide-by 33/34/44/45 counter. Each desynchronizer generates a clock for each of the twenty-eight T1/E1 channels based on a FIFO depth count for each channel which is derived from a read pointer, an "effective write pointer", and the divide-by clock for the channel. The FIFO depth counts are updated for seven channels every nine SONET rows (on a specified TOH byte), i.e. all twenty-eight FIFO depth counts get updated every thirty-six SONET rows (four frames). Unlike conventional desynchronizers which utilize separate leak and desynchronize FIFOs, the demappers and desynchronizers of the invention combine leak and desynchronize FIFOs into a single FIFO. The FIFO count which separates the leak and desynchronizing portions of the FIFO is what is referred to as the "effective write pointer". Each desynchronizer can desynchronize both T1 and E1 signals as well as a combination of these signals. The shared RAM based digital phase locked loops of the desynchronizers are more efficient than the flip-flops used in individual phase locked loops of the prior art. By sharing most of the components of the desynchronizer, chip area is saved, thus allowing a higher density component.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
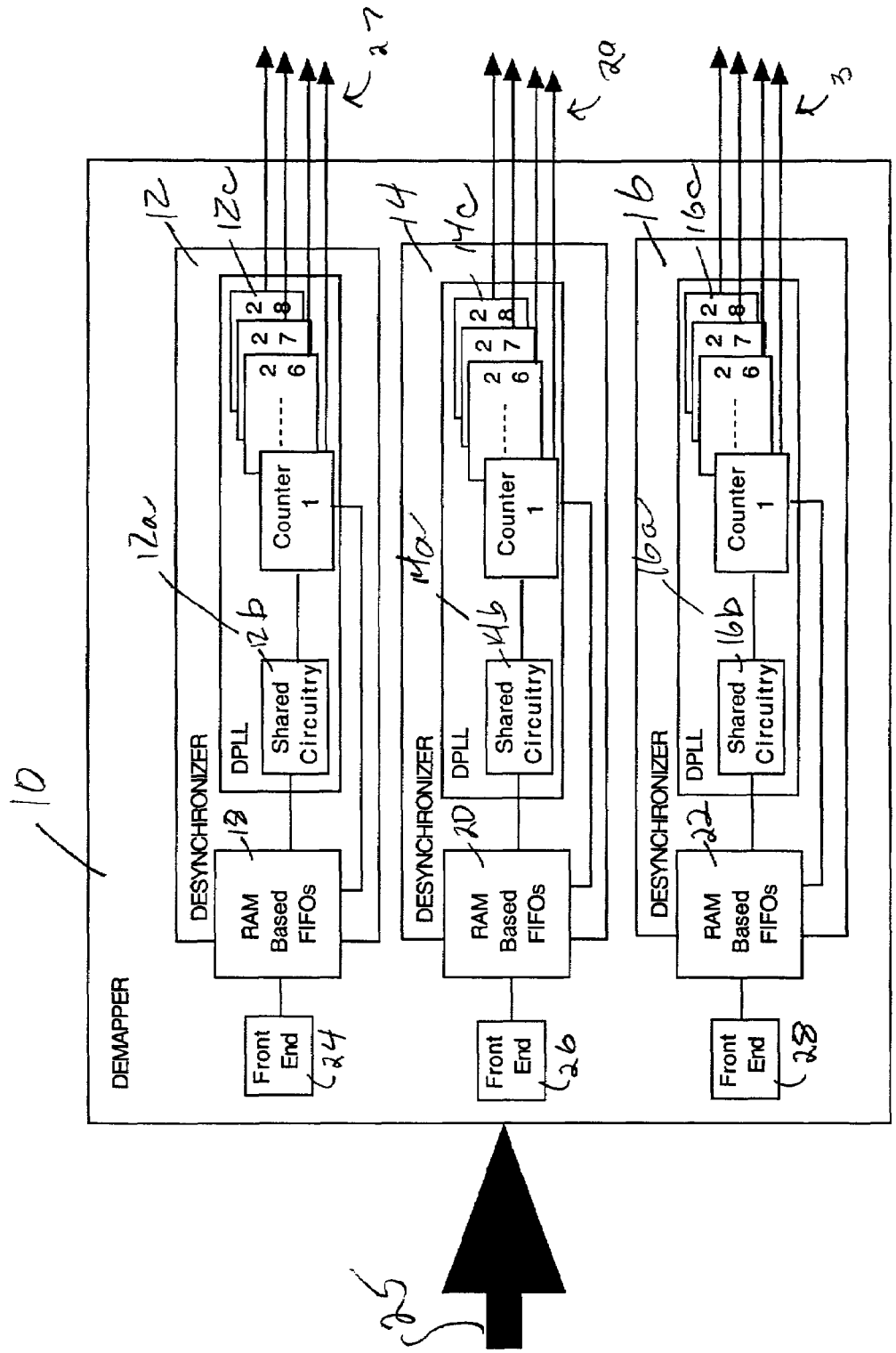
FIG. 1 is very simplified block diagram illustrating a demapper incorporating three desynchronizers according to the invention.

Referring now to FIG. 1, a demapper 10 according to the invention includes three desynchronizers 12, 14, 16, three associated RAM based FIFOs (data buffers) 18, 20, 22 and three "front end" circuits 24, 26, 28. Each desynchronizer 12, 14, 16 has a plurality of digital phase locked loops (DPLLs) 12a, 14a, 16a which are comprised of shared circuitry 12b, 14b, 16b and a plurality (twenty-eight) counter circuits 12c, 14c, 16c. The" counter circuits are configurable for either T1 or E1 signals. For an E1 signal, the counter circuits count from 33/34. For a T1 signal, the counter circuits count from 44/45. As indicated by the arrow 25, the demapper 10 is capable of demapping multiple tributary units (TUs), i.e. up to eighty-four T1 signals, sixty-three E1 signals or a combination of such signals within the bandwidth of an STS-3 SONET signal. As indicated by the arrows 27, 29, 31, the demapper 10 outputs multiple individual T1/E1 signals in groups of twenty-one to twenty-eight.

The input of the demapper 10 is obtained from an overhead terminator (not shown) such as the PHAST® terminator manufactured by Transwitch Corporation, Shelton, Conn. The PHAST® terminator outputs a byte-wide serial stream of multiplexed tributary units (also known as a Virtual Tributaries) with most of the SONET overhead bytes removed. This serial data stream includes up to sixty-three or eighty-four TUs multiplexed according to SONET mapping techniques. Moreover, the serial data stream includes substantial jitter. The demapper 10 demaps (demultiplexes) the individual T1/E1 data streams and distributes these jittery data streams into individually addressed RAM based FIFOs 18, 20, 22. Each of these RAM blocks 18, 20, 22 provides sufficient memory for up to twenty-eight FIFOs. Each of these FIFOs, is a combined leak and desynchronizer FIFO and each stores up to sixty-four bits (±4 pointer movements for leaking) plus sixty-four bits for de-jittering. Each FIFO has one write pointer and one or more (in the case of multicasting) read pointers. The leak FIFO depth is subtracted from the write pointer when depth measurement is updated and the difference is the "effective write pointer".

Figure 2:
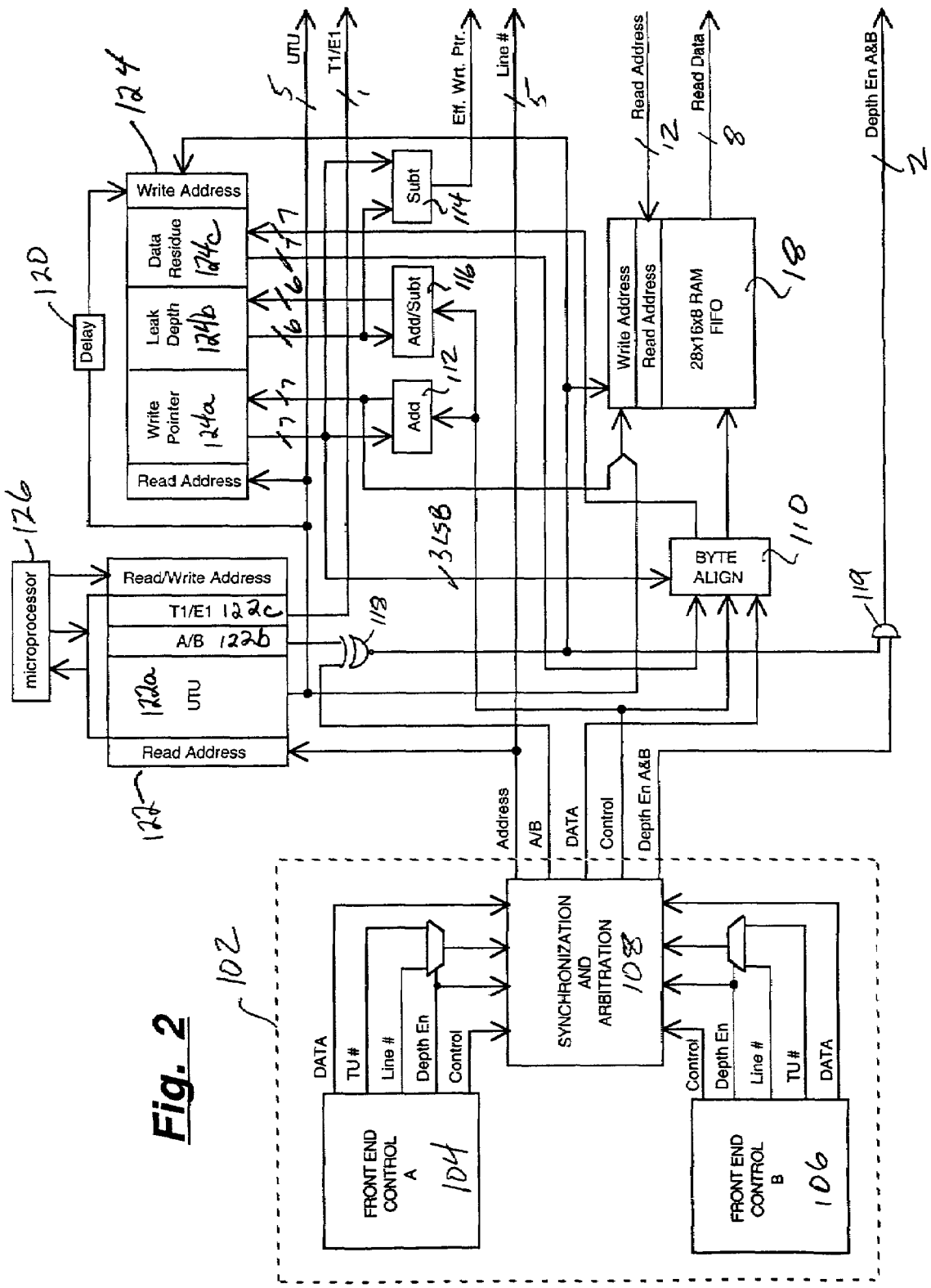
FIG. 2 is a high level component block diagram of the "front end" of a demapper according to the invention.
Figure 3:
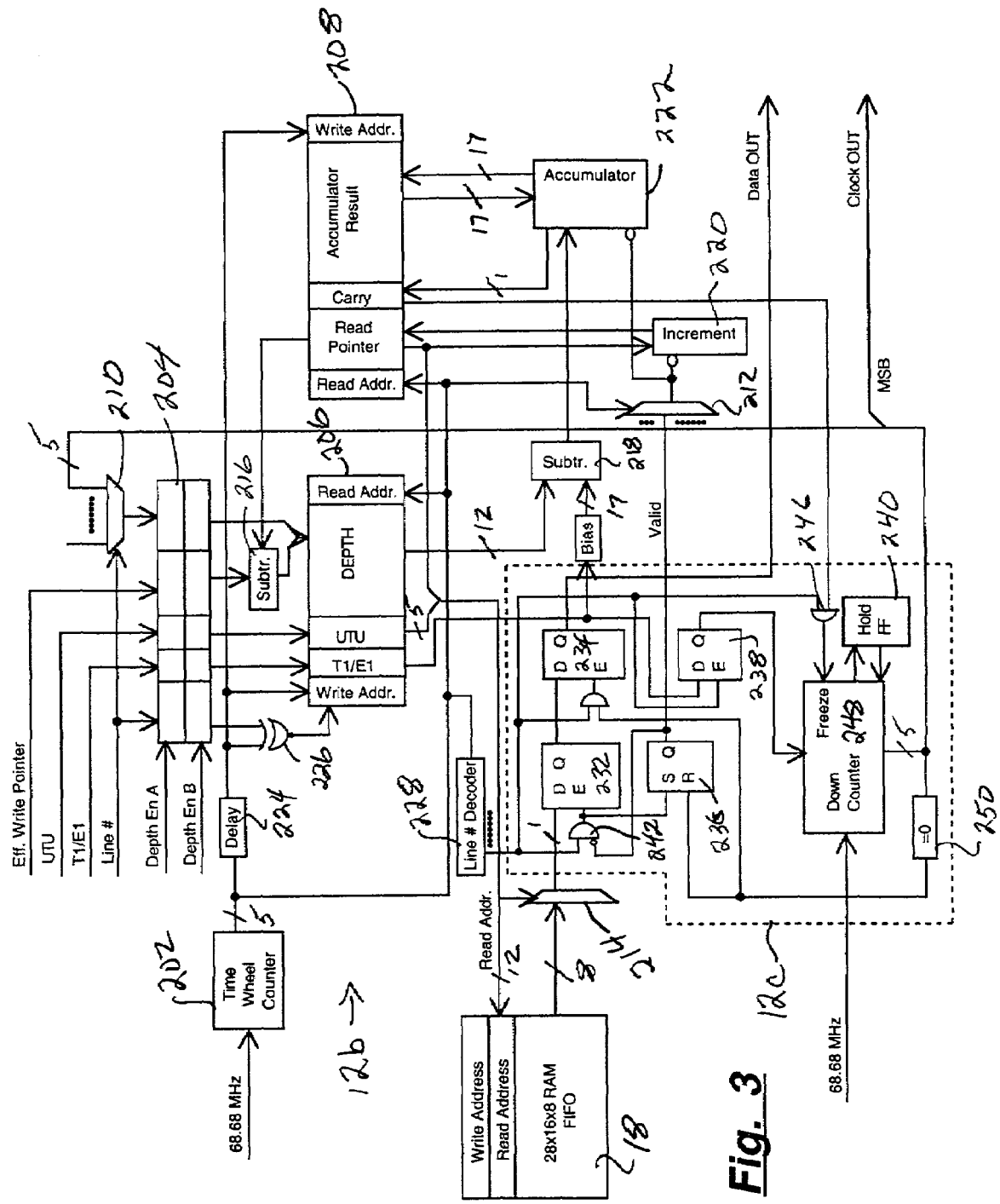
FIG. 3 is a high level component block diagram of the desynchronizer according to the invention.

Details of the demapper and desynchronizer of the invention are see with reference to FIGS. 2 and 3 where a single RAM based FIFO 18 and desynchronizer 12 are shown for purposes of brevity.

Referring now to FIG. 2, the demapper 10 includes a shared RAM FIFO 18 which is written to by an overhead terminator 102 which includes a front end control A 104, a front end control B 106, and a synchronization and arbitration block 108. The other supporting circuitry for writing to the FIFO 100 includes a byte alignment module 110, an adder 112, a subtracter 114, an adder/subtracter 116, an XNOR gate 118, and AND gate 119 a delay line 120, (fifty-six word deep) addressing RAM 122 and buffer 124, and a control microprocessor 126. The addressing RAM is used to map line #s (twenty-eight words) and TUs (twenty-eight words) to UTUs. The control microprocessor 126 may be located either on the chip or off the chip.

The front end control A 104 and front end control B 106 allow the device to be coupled to an optical ring. Each front end control derives the following signals from the SONET frame: data, tributary unit number (TU#), line number (for depth measurement), depth enable and control. The synchronization and arbitration unit 108 takes these signals and provides the following signals: address (a multiplexing of TU# and line #), A/B indicator, data, control, and Depth enable A&B. When Depth Enable is asserted, the line # is selected and when Depth Enable is not asserted, TU# is selected. The address is used to address the RAM 122 and when the line # is selected, the address is forwarded to the back end as illustrated by the arrow labeled "Line #". The line # is a five bit decode of the SONET row in a four frame multiframe. The addressing RAM 122 uses the address to output a five bit "used tributary unit" (UTU) number which is forwarded to the back end as indicated by the arrow labeled "UTU". The UTU is a mapping of A or B side TUs to one of twenty-eight channels and a line # to any FIFO channel allowing broadcasting or multicasting. This mapping is set up by the processor 126 in the RAM 122. The UTU also specifies a read address in buffer 124 and specifies the same write address in buffer 124 after one clock delay 120. The read addressing of the buffer 124 causes a write pointer 124a, leak depth 124b, and data residue 124c to be read out of the buffer The delayed write addressing causes the same locations in the buffer 124 to be written with new data from the adder 112, the adder/subtracter 116, and the byte align block 110. The UTU is also concatenated with a write pointer from the adder 112 to supply the write address to the FIFO RAM 18. The microprocessor 126 also determines the value of the T1/E1 bit stored at 122c which is output to the back end as indicated by the arrow labeled "T1/E1". The A/B indicator is coupled via the XNOR gate 118 to an A/B selection stored at 122b in the addressing RAM 122. The output of the XNOR 118 is coupled via the AND gate 119 with the depth enable A&B which provides a two bit output to the back end as indicated by the arrow labeled "Depth En A&B". This signal also provides a write enable to the write address of FIFO RAM 18 and to the buffer 124.

Data is clocked into the FIFO 18 from the synchronization and arbitration block 108 together with data residue 124c (when necessary) from the addressing RAM 124. The data is clocked through the byte alignment module 110 using the control signal from the synchronization and arbitration block 108 and the write pointer 124a from the addressing RAM 124. Exactly one byte at a time is written into the RAM FIFO 18. If the data from the synchronization and arbitration block 108 is more than eight bits as indicated by the control signal, the bits in excess of eight are forwarded from the byte alignment module 110 to the data residue buffer 124c. If fewer than eight bits are received from the synchronization and arbitration block 108, bits from the data residue buffer 124c are used to make up a byte. If there are insufficient bits from these two sources to complete a byte of data, no write is done and the bits are all stored in the data residue buffer 124c.

The control signal from the synchronization and arbitration block 108 is also delivered to the adder 112 and the adder/subtracter 116. The adder 112 counts up the write pointer which is stored in buffer 124a and is used as described above to address the FIFO RAM 18 when writing to it. The adder/subtracter 116 adjusts the leak depth stored in the buffer 124b based on positive and negative pointer movements or leak commands in the control signal from the synchronization and arbitration block 108. The subtracter 114 calculates the difference between the write pointer stored in the buffer 124a and the leak depth stored in the buffer 124b to determine the "effective write pointer" which is forwarded to the back end as illustrated by the arrow labeled "Eff. Wrt. Ptr.". As will be described in more detail below with reference to FIG. 3, data is read from the RAM FIFO 18 as indicated by the arrow labeled "Read Data" based on an address supplied from the back end as indicated by the arrow labeled "Read Address".

The depth enable from the front end control allows addressing of RAM 122 and, via the UTU output of 122a, RAM 124 for the purpose of depth measurement. The depth measurements are made during the TOH overhead bytes of eight of the nine SONET frame rows so that the depth is measured for each line once every four SONET frames Turning now to FIG. 3, the back end of the demapper is coupled to the same FIFO RAM 18 and generally comprises a plurality of DPLLs 12a which are made from a single shared circuitry 12b and a plurality of counter modules 12c. The shared circuitry 12b includes a time wheel counter 202, a pair of registers 204, various buffers 206, 208, multiplexers 210, 212, 214, subtracters 216, 218, an incrementer 220, an accumulator 222, a one clock delay 224, an XNOR gate 226, and a line decoder 228. The number of counter modules 12c corresponds to the number of lines (T1/E1) that are to be demapped. Each counter module 12c preferably includes five flip-flops 232, 234, 236, 238, 240, three AND gates 242, 244, 246, a down counter 248, and a zero comparator 250.

As mentioned above with reference to FIG. 2 and as shown by the labeled arrows in FIG. 3, the back end of the demapper receives the following signals from the front end: Effective Write Pointer, UTU, T1/E1, Line #, Depth Enable A, Depth Enable B, and Data. The Effective Write Pointer, UTU, T1/E1, and Line # signals are stored in registers 204 with separate values for the A and B directions since the SONET frame and therefore the depth enable signals may be shifted in phase between A and B. The Data signal is selectively applied to the counter modules 12c as described below. In addition to receiving these signals, the back end receives a 68.68 MHz clock from a clock source (not shown). The frequency of the clock was carefully selected so that both T1 and E1 clocks can be derived from it.

The time wheel counter 202 selects a counter module 12c via the Line # decoder 228 which enables the DQ Flip-Flop 232 to latch in a bit from the FIFO RAM 18 based on the read address supplied to the RAM 18 and to the multiplexer 214. The down counter counts down from 33/34 or 44/45 depending on whether the data is T1 data or E1 data, this being selected by the DQ Flip-Flop 238 which receives the T1/E1 indication from the buffer 206, which in turn received the T1/E1 indication from the buffer 204 depending on the A/B depth enable. The output Q of the down counter 248 is a five bit signal. It will be appreciated that a five bit signal can only count to/from thirty-two. In order to count down from 33 or 44, the hold flip-flop 240 periodically holds the count for one clock cycle in order to evenly distribute "extra counts". In order to count from 34 or 45, the freeze input of the counter is asserted by the output of the AND gate 246 as determined by an accumulated carry signal described in more detail below. When the counter output Q is zero as determined by the zero comparator 250, the AND gate 244 is triggered and causes data to move from the flip-flop 232 through flip-flop 234 to the "Data OUT" line of the demapper. The zero signal also causes flip-flop 236 to reset which sends a "Valid" signal to enable the incrementer 220 and the Accumulator 222 via the multiplexer 212 which has selected the counter module 12c based on the time wheel counter 202.

The Q output (which is a fractional part of the read pointer in thirty-seconds of a bit) of the down counter 248 is stored in a part of buffer 204 selected by multiplexer 210 which is controlled by the Line # signal. The most significant bit of the Q output of the down counter 248 is the "Clock OUT" line of the demapper.

The incrementor 220 increments a read pointer stored in buffer 208 which is concatenated with the UTU from buffer 206 to form the read address used to address the RAM FIFO 18. From the foregoing, it will be appreciated that the read pointer is incremented every time data is read from the counter module 12c. It will also be appreciated that there are separate read pointers for each of the counter modules 12c. The appropriate read pointer from buffer 208 is selected by the read address provided to the buffer 208 by the time wheel counter 202. The incremented read pointer is written to the appropriate address in buffer 208 based on the write address received from the time wheel counter 202 after a one cycle delay at 224.

The read pointer stored in buffer 208 is also used to calculate the depth measurement stored in buffer 206. The depth measurement is the (7 bit) difference between the read pointer and the effective write pointer as determined by subtracter 216, concatenated with the fractional value of the output of the down counter 248 associated with this Line #. The depth measurement is read out of the buffer 206 based on the read address supplied by the time wheel counter 202. The depth measurement is written into the buffer 206 based on the write address which is one cycle delayed by delay 224. The buffer 206 is only write enabled when the delayed time wheel count is the same as the Line # as established by XNOR 226, at which time data from the registers 204 is written to the appropriate address in the buffer 206.

In order to implement the phase locked loop, the depth measurement read from the buffer 206 is subtracted from a (17 bit) bias value by subtracter 218 and the result is sent to the accumulator 222. The bias, which is different for E1 and T1, is chosen so that it will, with the FIFO depth at midpoint, produce a carry which will modulate the down counter so as to produce the nominal E1 or T1 average frequency. The accumulator reads an accumulator value from the buffer 208, adds to it the results from the subtracter 218 and writes the new accumulator result back to the buffer 208 on the next clock cycle. When the accumulator overflows, a carry value is written to the buffer 208. The carry value is used in conjunction with the output of flip-flop 238 to freeze the down counter 248 for the "extra" 34th or 45th count as described above. Thus, when the rate of incoming data exceeds the rate at which data is being written out, the buffer depth increases resulting in a decrease in the output of the subtracter. As a result, the accumulator will overflow less often and fewer carries will be generated. With fewer carries, the down counter 248 will freeze less often, resulting in a more frequent zero count and a slightly increased output data rate. When the rate of incoming data is less than the rate at which data is written out, the opposite occurs.

There have been described and illustrated herein a desynchronizer and a high density SONET demapper incorporating the same. While particular embodiments of the invention have been described, it is not intended that the invention be limited thereto, as it is intended that the invention be as broad in scope as the art will allow and that the specification be read likewise. Thus, while the desynchronizer has been illustrated with twenty-eight counters for servicing twenty-eight tributary units, more counters or fewer counters could be used depending on the application. Similarly, while the demapper has been shown as containing three desynchronizers, more desynchronizers or fewer desynchronizers could be used depending on the application. Further, while the presently preferred clock is 68.68 MHz, it will be appreciated that there are other suitable frequencies. It will therefore be appreciated by those skilled in the art that yet other modifications could be made to the provided invention without deviating from its spirit and scope as so claimed.

The invention claimed is:

1. A desynchronizer for a SONET demapper, comprising:
   a) a data FIFO for storing data for a plurality of channels;
   b) a plurality of digital phase locked loops coupled to said FIFO for reading data out of said FIFO, said plurality of digital phase locked loops being implemented with shared circuitry for generating FIFO read addresses and a plurality of divide-by counters for outputting data, said divide-by counters selectively coupled, one at a time, to said shared circuitry in response to a clock signal, wherein said read addresses include a used tributary unit which allows for multicasting;
   c) a depth calculator for determining a FIFO depth of each of said channels, said depth calculator being selectively coupled, one at a time, to said divide-by counters in response to a clock signal, wherein said depth calculator includes
   a first subtracter coupled to a read pointer and an effective write pointer, wherein
      said effective write pointer is the difference between a write pointer and a leak depth.

2. A desynchronizer according to claim 1, wherein each of said divide-by counters includes:
   a count stopper responsive to said depth calculator for adjusting the counting rate of the divide-by counter based on FIFO depth.

3. A desynchronizer according to claim 1, wherein each of said divide-by counters includes:
   a data output and a clock output providing data and clock signals for the channel associated with the divide-by counter.

4. A desynchronizer according to claim 1, wherein:
   each of said divide-by counters is configurable to read either T1 or E1 data.

5. A desynchronizer according to claim 1, wherein:
   said clock signal is 68.68 MHz.

6. A desynchronizer according to claim 1, wherein said shared circuitry includes:
   a time wheel counter coupled to a clock, said time wheel counter providing said clock signal.

7. A SONET demapper, comprising:
   a) a plurality of desynchronizers, each desynchronizer including
      i) a data FIFO for storing data for a plurality of channels; and
      ii) a plurality of digital phase locked loops coupled to said FIFO for reading data out of said FIFO, said plurality of digital phase locked loops being implemented with shared circuitry for generating FIFO read addresses and a plurality of divide-by counters for outputting data, said divide-by counters selectively coupled, one at a time, to said shared circuitry in response to a clock signal; and
   b) a plurality of front end circuits, each coupled to one of said data FIFOs, and each coupled to a source of a SONET signal, wherein
      each of said front end circuits provides a used tributary unit for each channel which allows for multicasting, each of said shared circuitry further comprises a depth calculator for determining a FIFO depth of each of said channels, said depth calculator being selectively coupled, one at a time, to said divide-by counters in response to a clock signal,
      said depth calculator includes a first subtracter coupled to a read pointer and an effective write pointer, the read pointer being generated by said shared circuitry and the effective write pointer being generated by a corresponding front end circuit.

8. A SONET demapper according to claim 7, wherein each of said divide-by counters includes:
   a count stopper responsive to said depth calculator for adjusting the counting rate of the divide-by counter based on FIFO depth.

9. A SONET demapper according to claim 7, wherein:
   said effective write pointer is the difference between a write pointer and a leak depth.

10. A SONET demapper according to claim 7, wherein each of said divide-by counters includes:
    a data output and a clock output providing data and clock signals for the channel associated with the divide-by counter.

11. A SONET demapper according to claim 7, wherein:
    each of said divide-by counters is configurable to read either T1 or E1 data.

12. A SONET demapper according to claim 11, wherein:
    each of said front end circuits provides an E1/T1 indicator for each channel.

13. A SONET demapper according to claim 7, wherein:
    each of said front end circuits provides a depth enable indicator.

* * * * *